United States Patent
Wang

(10) Patent No.: US 6,255,913 B1
(45) Date of Patent: Jul. 3, 2001

(54) VARIABLE FREQUENCY OSCILLATOR CIRCUIT

(75) Inventor: Hongmo Wang, Watchung, NJ (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/412,462

(22) Filed: Oct. 4, 1999

(51) Int. Cl.[7] .................................................. H03J 5/24
(52) U.S. Cl. ................... 331/181; 331/36 L; 331/177 V; 331/36 C; 334/14; 334/15; 334/47
(58) Field of Search ................................. 334/14, 15, 47; 331/181, 36 L, 117 R, 167, 177 V, 36 C; 336/146

(56) References Cited

FOREIGN PATENT DOCUMENTS

2143693 * 2/1985 (GB) ..................................... 331/181

* cited by examiner

*Primary Examiner*—Arnold Kinkead
(74) *Attorney, Agent, or Firm*—Cohen, Pontani, Lieberman & Pavane

(57) ABSTRACT

A variable frequency oscillator (VFO) circuit having an increased frequency tuning range to selectively obtain operating frequencies above and below a set frequency. The circuit includes a tank inductor connected in parallel with a tank capacitor for primarily defining the set oscillating frequency of the VFO circuit. A switchable capacitor is included for selectively providing a predetermined step-wise decrease of the oscillating frequency to a frequency value below the set frequency of the circuit, and a varactor is included for accommodating selective tuning of the oscillating frequency within a range of frequency values below the set frequency. The inventive circuit selectively includes a switchable inductance element which is selectively electromagnetically coupled to the tank inductor to decrease the overall inductance value of the VFO circuit and, thereby, selectively increase the oscillating frequency above the set frequency value.

12 Claims, 1 Drawing Sheet

VARIABLE FREQUENCY OSCILLATOR CIRCUIT

BACKGROUND OF THE INVENTION

1. Field of the Invention

The present invention pertains to variable frequency oscillators (VFOs) and, more particularly, to a VFO having an increased tunable frequency range.

2. Description of the Related Art

Currently employed variable frequency oscillators (VFOs) are manufactured to achieve a desired target frequency (F) and provide for a limited tuning range relative to the circuit operating frequency to accommodate for shifts caused during manufacture or as required for operation. This tuning range allows the operating frequency to be adjusted downward from an actual frequency value to a value closely proximate the target frequency. Such VFOs include a tank circuit and an active device, such as a transistor, connected to a control box for adjusting the VFO frequency.

A known prior art VFO circuit 5 is shown in FIG. 1 having a tank circuit 10 connected to an active device 20. The tank 10 employs an LC oscillator circuit having a tank inductor L with a fixed inductance connected in parallel with a tank capacitor C having a fixed capacitance. A varactor having a variable capacitance value is provided for tuning the VFO frequency by adjusting the value of the varactor capacitance. Since the varactor is connected in parallel with tank capacitor C, the overall capacitance of the VFO circuit will be increased by a maximum value of the maximum varactor capacitance ($\Delta C$), thereby reducing the frequency F of the tank 10 by a maximum amount ($\Delta f$). In addition, a switchable capacitor C' is connected in parallel to the load capacitor C by a switch S1 for providing a stepped increase of the overall capacitance of the tank 10 and, therefore, a stepped decrease ($\Delta f'$) in the resulting frequency. For example, when switch S1 is closed, thereby incorporating capacitor C' into tank circuit 10, the overall capacitance of the circuit will be $C+C'+\Delta C$, resulting in a frequency of $F-\Delta f'-\Delta f$. As such, currently employed VFO circuits, such as the circuit 5 of FIG. 1, are limited in that they only provide for the VFO frequency to be reduced downward from a set frequency, as opposed to also or alternatively being increased above the set frequency, thereby limiting the versatility and tuning range of these known VFO circuits. Although it may be possible, to an extent, to over-design tank circuits having an increased maximum frequency with an increased downward tuning range—in an attempt to avoid the need for an upward tuning range—such an alternative is limited. This is because the incorporation of multiple switches S1 for the required multiple switchable capacitors needed to increase the downward tuning range add detrimental parasitic capacitance to the tank.

SUMMARY OF THE INVENTION

The present invention is directed to a variable frequency oscillator circuit having an increased tunable frequency range. The inventive VFO circuit includes a parallel connected load capacitor and load inductor having capacitance and inductance values, respectively, which determine the VFO set frequency F. A varactor is provided having a variable capacitance $\Delta C$ for decreasing the operating frequency F by an amount $\Delta f$. A secondary inductor selectively affects the load inductor for reducing the overall inductance of the VFO circuit for providing a stepped increase of the operating frequency of the VFO above the set frequency. In this manner, the tunable frequency range of the VFO circuit includes attainable frequencies both below and above the set frequency F.

In a preferred embodiment, a selectively connectable fixed capacitor is included for providing a stepped decrease of the operating frequency when the fixed capacitor is connected to the VFO circuit.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims.

BRIEF DESCRIPTION OF THE DRAWINGS

In the drawings, wherein like reference characters denote similar elements throughout the several views.

DETAILED DESCRIPTION OF THE PRESENTLY PREFERRED EMBODIMENTS

Figure 1:
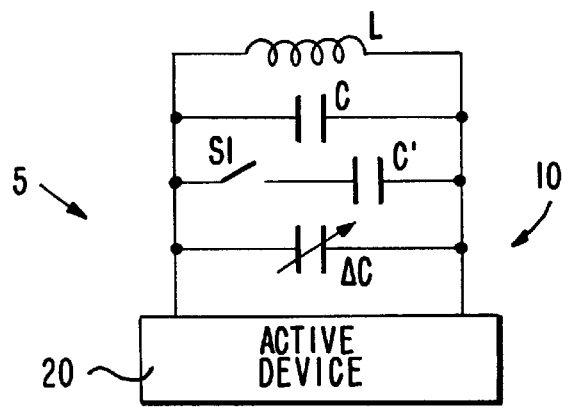
FIG. 1 is a schematic representation of a prior art variable frequency oscillator circuit.
Figure 2:
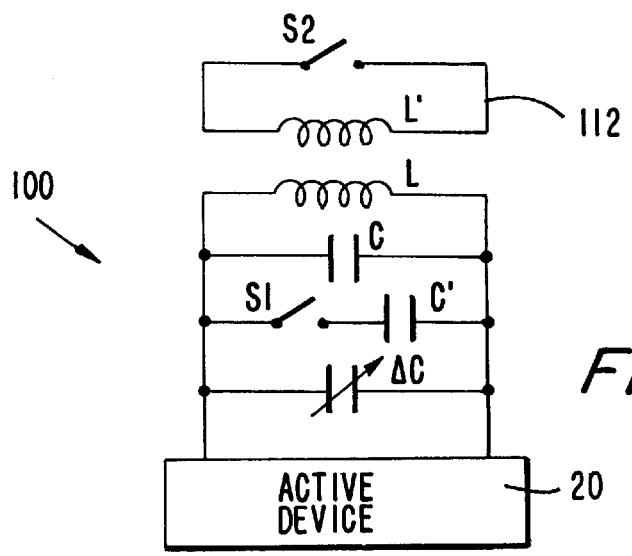
FIG. 2 is a schematic representation of a variable frequency oscillator circuit in accordance with a preferred embodiment of the present invention.

A tank circuit 100 for use in a variable frequency oscillator (VFO) constructed in accordance with the present invention is shown in FIG. 2. Like the prior art tank circuit 10 discussed above, circuit 100 is typically used in connection with an active device 20, such for example as a transistor, and includes an LC arrangement having a fixed value tank inductor L and a fixed value tank capacitor C connected in parallel to each other. Also like the prior art circuit 10, circuit 100 includes a selectively engageable capacitor having a fixed capacitance C' which is connected to a switch S1 for selectively connecting the engageable capacitor to the circuit to increase the overall capacitance of the circuit by an amount C'; this causes the set frequency F of the circuit to be reduced by a fixed or step amount $\Delta f'$. Switch S1 may be implemented or operated in any manner known to those skilled in the art, such as by a MOSFET transistor. To provide for fine tuning of the overall VFO frequency, a variable capacitance or varactor is included in parallel with the tank capacitor for adding to the circuit 100 a variable amount of capacitance up to an amount $\Delta C$ thereby enabling selective fine-tuning of the overall frequency of the circuit by an amount not greater than $\Delta f$ below the set frequency F or below frequency $F-\Delta f'$.

The switchable and variable capacitances discussed above allow selective reduction of the operating or set frequency F of the circuit 100 by adding capacitance to the circuit. However, these elements do not provide for any desired or required increase of the circuit frequency above the fixed operating frequency F. Thus, for example, when VFO circuits are produced in bulk to yield a target frequency, a significant number of the resulting VFO circuits will have operating frequencies variously higher than and lower than the target frequency as a result, inter alia, of frequency drift caused by inherent manufacturing factors and procedures. Those VFO circuits having operating frequencies higher than the target frequency can be tuned downward to reduce the frequency by engaging capacitor C' and/or utilizing the varactor. However, such capabilities alone do not, as in the prior art circuit 10, allow the operating frequency to be increased to approach a target frequency.

To solve this problem, circuit 100 incorporates, in the vicinity of the tank inductor L, a switchable secondary inductor 112 having an inductance value L'. Such a feature lowers the overall inductance of circuit 100 and thereby causes a stepped increase in the overall operating frequency of the circuit, i.e. allows the circuit operating frequency to be increased to or above a particular target frequency. The secondary inductor is preferably incorporated in circuit 100 by activating a switch S2. As the secondary inductor and switch S2 have no electrical connection to the remainder of the tank circuit, there are no parasitic capacitance effect. Moreover, when switch S2 is open, the secondary inductor has no effect on the inductance of the tank inductor L. In a preferred embodiment, switch S2 is implemented by a MOSFET device and, particularly, a CMOS transistor.

Figure 3:
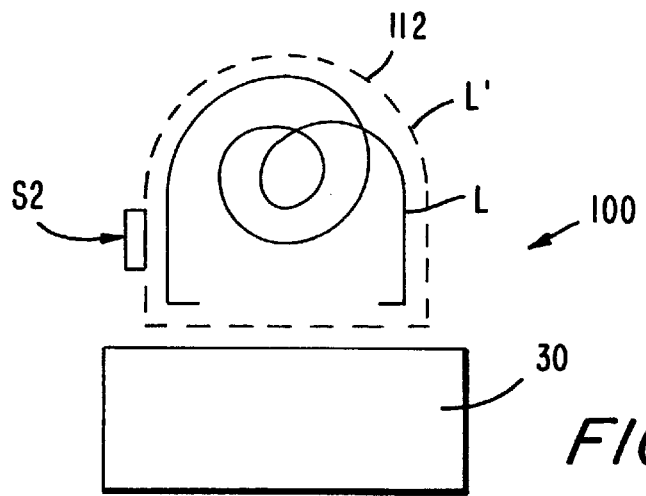
FIG. 3 depicts a switchable inductor element for use in conjunction with the preferred embodiment of the present invention shown in FIG. 2.

The addition of secondary inductor 112 into circuit 100 is accomplished, as shown in FIG. 3, by physically forming an inductor coil on a substrate in electromagnetically close proximity to the tank inductor L so that, when switch S2 is activated or closed, current will flow through the secondary inductor 112 and reduce the effective inductance of the tank inductor L. This, as explained above, causes the overall inductance of the circuit 100 to be reduced, thereby increasing the circuit operating frequency by an amount proportional to the value of secondary inductance L'. In FIG. 3, element 30 diagrammatically represents the combination of the active device 20, varactor, switchable capacitor C', tank inductor L and tank capacitor C of FIG. 2.

Thus, while there have shown and described and pointed out fundamental novel features of the invention as applied to a preferred embodiment thereof, it will be understood that various omissions and substitutions and changes in the form and details of the devices illustrated, and in their operation, may be made by those skilled in the art without departing from the spirit of the invention. For example, although circuit 100 is shown having a varactor and a switchable capacitor, either or both of these components can as a matter of design choice be omitted to thereby provide the ability to only increase the operating frequency of the circuit. It is in any event expressly intended that all combinations of those elements which perform substantially the same function in substantially the same way to achieve the same results are within the scope of the invention. Moreover, it should be recognized that structures and/or elements shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

I claim:

1. A tunable variable frequency oscillator (VFO) circuit operable for selectively adjusting the oscillating frequency of the circuit to a frequency value within a range extending from below to above a set frequency of the circuit, comprising:

a tank inductor having an inductance value L;

a tank capacitor having a capacitance value C and connected in parallel with said tank inductor;

a varactor connected in parallel with said tank capacitor for selectively increasing an overall capacitance of said VFO circuit to thereby decrease the oscillating frequency of the circuit below the set frequency; and a second inductor electromagnetically coupled with said tank inductor and selectively conductable to decrease an overall inductance of said VFO circuit without causing any parasitic capacitance effect to said VFO circuit and thereby increase the oscillating frequency of said VFO circuit above the set frequency.

2. The circuit of claim 1, further comprising a switchable capacitor having a fixed capacitance value for providing selective parallel connection of said switchable capacitor with said tank capacitor, for providing a step-wise increase of an overall capacitance value by said fixed capacitance value to effect a step-wise decrease of the oscillating frequency to a frequency value below the set frequency.

3. The circuit of claim 2, wherein said switchable capacitance is connected to a CMOS switch operable to selectively connect the switchable capacitor to the circuit in parallel with said tank capacitor.

4. The circuit of claim 1, wherein said secondary inductor is connected to a CMOS switch operable to cause selective conduction of the secondary inductor.

5. The circuit of claim 1, wherein said secondary inductor is formed on a common substrate with said tank inductor.

6. A tunable variable frequency oscillator (VFO) circuit operable for selectively adjusting the oscillating frequency of the circuit to a frequency value above a set frequency of the circuit, comprising:

a tank inductor having an inductance value L;

a tank capacitor having a capacitance value C and connected in parallel with said tank inductor; and a secondary inductor electromagnetically coupled to said tank inductor so that there is no electrical connection between said secondary inductor and said tank inductor, said secondary conductor being selectively conductable to decrease an overall inductance of said VFO circuit and thereby increase the oscillating frequency of the circuit above the set frequency.

7. The circuit of claim 6, further comprising a varactor connected in parallel with said tank capacitor for selectively increasing an overall capacitance of said VFO circuit to thereby decrease the oscillating frequency of the circuit below the set frequency.

8. The circuit of claim 7, further comprising a switchable capacitor having a fixed capacitance value for providing selective parallel connection of said switchable capacitor with said tank capacitor, said overall capacitance of said circuit being step-wise increased by said fixed capacitance value to effect a step-wise decrease of the oscillating frequency to a frequency value below the set frequency.

9. The circuit of claim 8, wherein said switchable capacitance is connected to a CMOS switch operable to selectively connect the switchable capacitor to the circuit in parallel with said tank capacitor.

10. In a tunable variable frequency oscillator (VFO) circuit wherein the oscillating frequency of the circuit is selectively adjustable to frequency values within a range extending from below to above a set frequency of the circuit, the circuit including a tank inductor having an inductance value L, a tank capacitor having a capacitance value C and connected in parallel to the tank inductor, a varactor connected in parallel with the tank capacitor for selectively increasing an overall capacitance of the VFO circuit to thereby decrease the oscillating frequency of the circuit below the set frequency, the improvement comprising:

a secondary inductor electromagnetically coupled with the tank inductor and selectively conductable to decrease an overall inductance of the VFO circuit without causing any parasitic capacitance effect to said VFO circuit and thereby increase the oscillating frequency of said VFO circuit above the set frequency.

11. The circuit of claim 10, wherein the improvement further comprises a switchable capacitor having a fixed capacitance value for providing selective parallel connection of said switchable capacitor with the tank capacitor, said overall capacitance of said circuit being step-wise increased by said fixed capacitance value to effect a step-wise decrease of the oscillating frequency to a frequency value below the set frequency.

12. The circuit of claim 10, wherein said secondary inductor is formed on a common substrate with the tank inductor.

* * * * *